United States Patent
Ehrenreich et al.

(10) Patent No.: US 7,808,856 B2
(45) Date of Patent: Oct. 5, 2010

(54) METHOD TO REDUCE LEAKAGE OF A SRAM-ARRAY

(75) Inventors: Sebastian Ehrenreich, Schoenau (DE); Juergen Pille, Stuttgart (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/143,430

(22) Filed: Jun. 20, 2008

(65) Prior Publication Data

US 2009/0285046 A1    Nov. 19, 2009

(51) Int. Cl.
G11C 5/14        (2006.01)
G11C 11/00     (2006.01)

(52) U.S. Cl. .................. 365/229; 365/154; 365/226
(58) Field of Classification Search .................. 365/154, 365/155, 156, 226, 227, 229
See application file for complete search history.

(56) References Cited

U.S. PATENT DOCUMENTS 7,126,370 B2    10/2006    Bhattacharya
2006/0215465 A1*    9/2006    Bhavnagarwala et al. ............ 365/189.12
2007/0005999 A1*    1/2007    Rusu et al. ............... 713/300
2007/0040575 A1*    2/2007    Afghahi et al. ............. 326/34

OTHER PUBLICATIONS

J. Pille et al. Implementation of the CELL Broadband Engine In a 65nm SOI Technology Featuring Dual-Supply SRAM Arrays Supporting 6GHz at 1.3V, 2007 IEEE International Solid-State Circuits Conference ISSCC2007/ Session 18/ SRAM/18.1.

Nabeel Sakran et al. "The Implementation of the 65nm Dual-Core 64b Merom Processor", 2007 IEEE International Solid State Circuits Conference. ISSCC 2007/Session 5/MICROPROCESSORS/5.6.

* cited by examiner

Primary Examiner—Ly D Pham
(74) Attorney, Agent, or Firm—Michael J. LeStrange

(57) ABSTRACT

A structure and method to reduce leakage of a Static Random Access Memory (SRAM) array, wherein the array is subdivided into a set of sub-arrays, whose supply voltages can be controlled independently using a single voltage regulation circuit dedicated to the entire SRAM array. A switch fabric enables independent switching of individual sub-arrays between a virtual ground level and a system ground level based on whether the sub-array is operating in power saving mode or a high performance mode to reduce leakage current when a sub-array is configured in a power saving mode.

5 Claims, 1 Drawing Sheet

METHOD TO REDUCE LEAKAGE OF A SRAM-ARRAY

FIELD OF THE INVENTION

Figure 1:
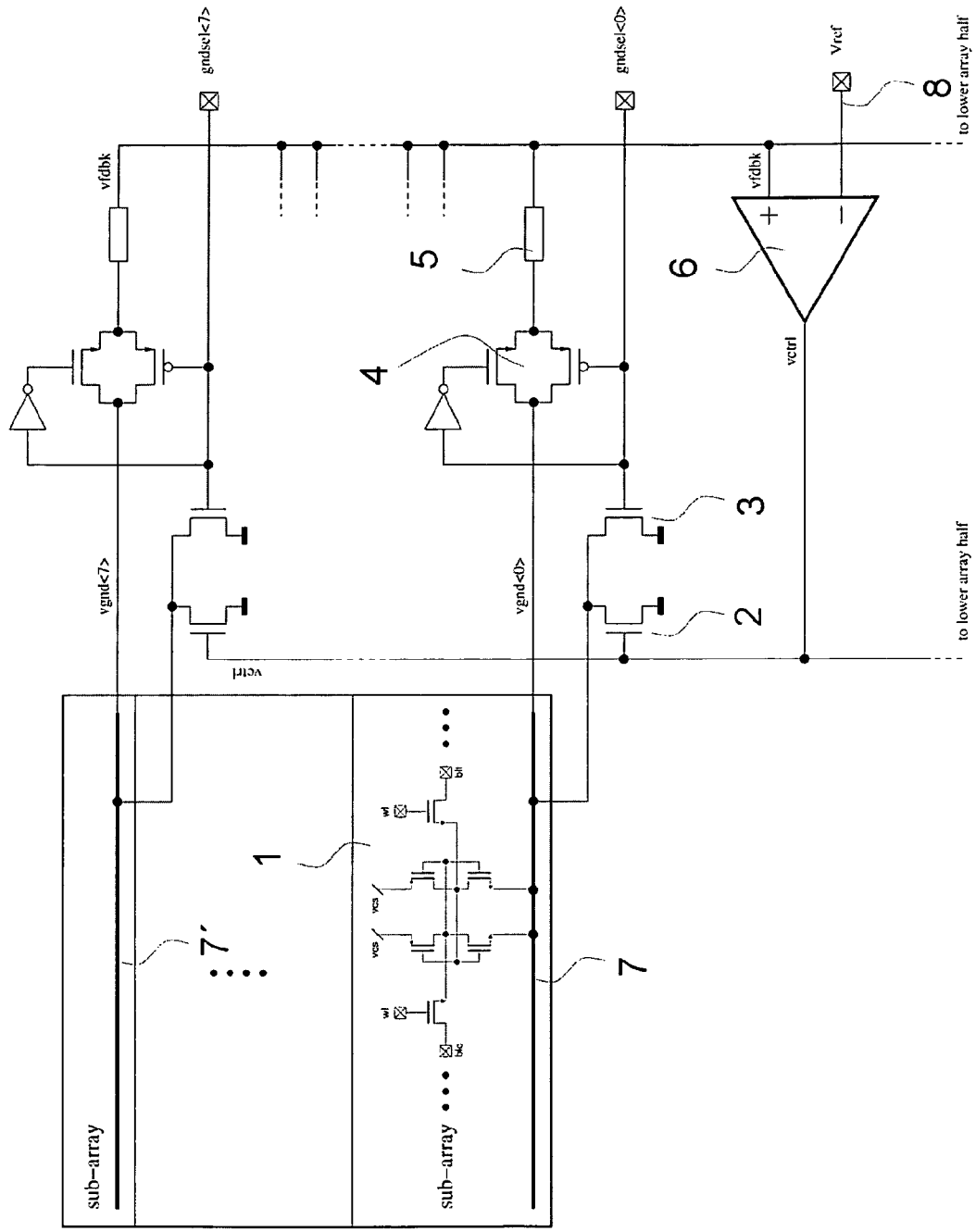

The invention relates to on-chip regulation of the supply voltage of a Static Random Access Memory (SRAM) Array, which consists of one or more Static Random Access Memory cells, in order to reduce leakage. More particularly, the invention relates to a method to reduce leakage of a Static Random Access Memory array, circuitry to control the supply voltage of a Static Random Access Memory array and a Static Random Access Memory array to be used to perform such a method and comprising such a circuitry.

Leakage current of a Static Random Access Memory (SRAM) cell is one of the main contributors to total power consumption of embedded memories. Because the number of memory cells is increasing with each new technology step, special care has to be taken on reducing the cell leakage current.

For example, this can be achieved by using special low-leakage devices in the SRAM cell. Unfortunately, there are physical limits in doing this. A disadvantageous side-effect of such leakage optimized cells is a reduced performance, particularly a reduced speed.

Other known solutions are targeting the SRAM cell supply voltage, which can be reduced to decrease leakage.

From Jürgen Pille et al.: "Implementation of the CELL Broadband Engine in a 65 nm SOI Technology featuring Dual Supply SRAM Arrays supporting 66 GHz at 1.3V", IEEE International Solid State Circuits Conference, 2007, pp. 322-323, it is known to use separate, external power supplies for the SRAM cells. Thereby, to improve performance of a SRAM cell which is supplied by a cell specific voltage and which is accessible for read and write operations via a bit line connected with a write circuit and which further is addressable by a word line in order to access it by the bit line, to access the cell, the word line is supplied by the cell specific voltage and the bit line is supplied by a core voltage, which is lower than the cell specific voltage, wherein during write operations, the write circuit is driven by the higher cell specific voltage. Doing so improves writeability of the cell. Thereby, the higher cell specific voltage is only used to switch the write circuit on and off, wherein the write circuit is supplied by the lower core voltage. This is because the write circuit at its output has to provide the core voltage, since the bit line has to remain at this lower voltage in order to keep the power consumption at a low level.

From Nabeel Sakran et al.: "The Implementation of the 65 nm Dual-Core 64b Merom Processor", IEEE International Solid State Circuits Conference, 2007, p. 106, it is known to use an on-chip circuitry to adjust a cell supply voltage. Thereby, to reduce leakage power, sleep transistors are implemented in memory arrays. The sleep transistors create a virtual cell supply voltage that gets significantly below the cell supply voltage level while still retaining the data stored in the cell. Disadvantageously, fast switching between performance and sleep mode is impossible due to high power requirements when switching the whole SRAM array.

From U.S. Pat. No. 7,126,370 B2 it is known that leakage power of an embedded memory may be reduced by controlling the supply voltage for a SRAM array in accordance with performance mode and sleep mode of the SRAM array. Thereby, it is foreseen to supply the SRAM array by a virtual ground rail that can be connected and disconnected from ground by a footer device. In order to prevent the output state of the SRAM array from being lost, a voltage clamp is used as a virtual rail clamp keeping the virtual ground rail below a certain predetermined voltage if the virtual ground rail is disconnected from ground. Unfortunately, no active, continuous time regulation of the virtual ground level is possible.

When reducing array cell leakage, several considerations must be taken into account, including the ability to maintain the integrity of the stored data in a reduced power mode and operation at elevated voltages to increase performance.

Due to the required support for both high-speed operation and low-power modes the cell supply voltage must be controllable. Furthermore switching between low-power and high-performance voltage settings must be possible in a short amount of time. Otherwise, cell access time will be increased and overall system performance may be compromised.

SUMMARY OF THE INVENTION

It is therefore an object of the invention to provide an on-chip regulation of the cell supply voltage in order to reduce leakage as a remedy for the problems mentioned above. More particularly, it is an object of the invention to provide a method to reduce leakage of an SRAM array by providing circuitry to control the supply voltage of a SRAM array, plus to provide an SRAM array to be used to perform such a method and comprising such a circuitry.

A method to reduce leakage of a Static Random Access Memory (SRAM) array, is disclosed according to which method the array, is separated or subdivided into a set of sub-arrays, whose supply voltages can be controlled independently. In so doing, the method according to the invention requires only one voltage regulation circuit for the whole SRAM array.

A preferred embodiment subdivides the SRAM array into an predefined number of sub-arrays based on anticipated power dissipation. A regulated virtual ground level is provided within the SRAM array using an integrated voltage regulator. Any of the subdivided sub-arrays may be individually connected to the voltage regulator through a switch fabric. The regulated virtual ground level is maintained at an electric potential higher than a system ground level, in order to reduce leakage during a power saving mode, e.g. sleep mode. The sub-arrays may be individually switched from a power saving mode to a high performance mode by independently disconnecting them from the regulated virtual ground level and connecting them to the system ground level, while keeping other sub-arrays in power saving mode, e.g. sleep-mode, preferably using only one global voltage regulator, i.e. one voltage regulator for the whole SRAM array.

The aforementioned embodiment provides a regulated virtual ground level higher than a system ground level connected to the sub-arrays. The sub-arrays may be independently connected to the regulated virtual ground level and the system ground level. In this regard, the supply voltages of the sub-arrays are independently controlled.

Regulating the virtual ground level to which the sub-arrays may be connected, has the advantage of eliminating bit-line leakage currents of sub-arrays connected to the regulated virtual ground level during sleep-mode. Furthermore a negative underdrive of cell passgates is achieved, further reducing leakage. Connecting a sub-array to the regulated virtual ground level during sleep-mode further has the advantage of ensuring the sub-array does not lose its stored content, which is a basic requirement of operation.

Switching performance between high performance and power saving mode is enhanced by limiting the switching from sleep and performance mode on a sub-array basis. The height of one sub-array is practically already defined by the number of cells which are connected to one local read/write circuit. The width of a sub-array is defined by the array size requirements.

Providing a regulated virtual ground level higher than a system ground level preferably is performed by including an on-chip voltage regulator inside the SRAM array for controlling the virtual ground level to which the sub-arrays may be connected.

Preferably, a local read/write circuit is used as a level shifter between virtual ground and system ground levels, without appreciably increasing circuit area.

According to a preferred embodiment, those sub-arrays switched from a reduced power mode to a high performance mode are detached from a feedback network regulating the virtual ground level in order to maintain stability of the feedback loop. Doing so reduces speed requirements for the regulation loop, particularly for a voltage regulator that is part of such a regulation loop.

A second aspect of the invention concerns circuitry to independently control the supply voltages of sub-arrays into which the array is subdivided. First, a circuit to regulate virtual ground level within the SRAM array to which the sub-arrays are individually connected, wherein the regulated virtual ground level has an electric potential higher than a system ground level in order to reduce leakage during a power saving mode, e.g. sleep mode. Second, a switch matrix to control individual switching of the sub-arrays from a power saving to a high performance mode. The switch fabric independently disconnects the sub-arrays from the regulated virtual ground level and connects them to the system ground level. The switching controller circuitry operates to keep other sub-arrays in power saving mode, e.g. sleep-mode, preferably using only one global voltage regulator, i.e. one voltage regulator for the whole SRAM array.

In a preferred embodiment individual sub-arrays may be independently configured to connect to a regulated virtual ground level to create an independent virtual ground network for each sub-array. A footer device connected to the virtual ground network whose gate is driven by a control voltage is used to adjust the voltage level of the virtual ground network, and therefore regulates the supply voltage across the SRAM cells.

In a preferred embodiment, another device is connected in parallel to the footer device, which is controllable by a separate signal used to switch the virtual ground network from virtual ground level to system ground level for high performance modes. Switching the ground levels is facilitated by disconnecting the virtual ground network from regulated virtual ground level and by connecting the virtual ground network to system ground level, which maximizes the available SRAM cell supply voltage for the sub-array connected to the virtual ground network. The switch from system ground level to virtual ground level for power saving mode is enabled by connecting the virtual ground network to a regulated virtual ground level. Leakage for the sub-array connected to the virtual ground network is reduced by disconnecting the virtual ground network from system ground level.

In an additional preferred embodiment to provide a regulated virtual ground level, the sub-arrays are individually connectable to realize a feedback network regulating the virtual ground level using an operational amplifier and an analog switch together with a resistor to feedback the virtual ground voltage level to the operational amplifier. In a high performance mode of a particular sub-array, the analog switch of a given sub-array is opened to disconnect the feedback of this particular sub-array from the virtual ground network. This ensures that the regulation loop for the remaining sub-arrays is unaffected by the forced system ground voltage condition. When the system is reconfigured from high performance mode to a low power mode, the virtual ground network is connected to the feedback network again.

When a sub-array is configured in a high performance mode, a separate signal for the sub-array is activated. The separate signal can be used to switch the analog switch disconnecting the feedback of this particular sub-array from the virtual ground level. This ensures that the regulation feedback loop for the remaining sub-arrays is unaffected by the forced system ground voltage condition. At the end of the high performance mode, the separate signal for the particular sub-array is deactivated and the sub-array is supplied by virtual ground by the switch connecting it to the feedback network again.

The resistor is necessary to decouple the virtual ground levels of the different sub-arrays against each other. The operational amplifier acts as a linear voltage regulator, adjusting voltage to achieve a virtual ground voltage level equal to the level of the reference voltage input impressed at the operational amplifier input. This input is used to preset the virtual ground level.

It is important to mention that the speed requirements for the regulation loop, comprising of the feedback network, the footer device and particularly the operational amplifier, are reduced, because sub-arrays switched to high performance mode are detached from the feedback network, keeping the regulation loop in a stabilized state.

In another preferred embodiment, the gates of the footer devices of all sub-arrays are connected in parallel to the output of the operational amplifier, in order to enable only one operational amplifier to be used to control the virtual ground voltage of all sub-arrays.

Those skilled in the art will appreciate that control of the supply voltages of sub-arrays is subdivided not by providing a regulated virtual ground level (vgnd) but by providing a regulated virtual positive voltage level. In this regard, the sub-arrays are individually configurable, such that the regulated virtual positive voltage level has an electric potential lower than a positive system voltage level. This circuitry individually switches the sub-arrays from a power saving mode to a high performance mode by individually disconnecting them from regulated virtual positive voltage level and connecting them to positive system voltage level, while keeping other sub-arrays in power saving mode.

Finally, a method is disclosed, wherein the SRAM array is subdivided into a predefined number of sub-arrays and includes the circuitry described above to realized reduced leakage.

The foregoing, together with other objects, features, and advantages of this invention can be better appreciated with reference to the following specification, claims and drawings.

BRIEF DESCRIPTIONS OF THE DRAWINGS

The present invention and its advantages are now described in conjunction with the accompanying drawing, where FIG. 1 illustrates a schematic of a circuit to independently control the supply voltages of individual sub-arrays of a SRAM array to reduce leakage of the SRAM array.

DETAILED DESCRIPTION OF THE INVENTION

Referring to FIG. 1, a schematic is presented showing an overview of the components required for a controller circuit to independently direct different magnitude supply voltages to different sub-arrays contained with the array. Each sub-array 1 has an independent virtual ground network 7, 7' that is controlled by a footer device 2. The gate of the footer device 2 is connected to a control voltage Vctrl, which is used to adjust the voltage level of the virtual ground network 7, 7', and therefore changes the supply voltage across the SRAM cells. A regulated ground, i.e. a regulated virtual ground vgnd impressed on the virtual ground network 7, 7' that is positive against system ground, is used instead of a regulated positive cell supply voltage Vcs.

By using a regulated virtual ground level, leakage current caused by SRAM cell passgate devices connected to the logic power supply level, is also reduced. This is because a raised ground level causes a negative overdrive of the pass-gate devices in off state, i.e. idle mode, resulting in the pass-gate device gate being connected to system ground, but the source is connected to the virtual ground vgnd, causing a negative control voltage across the passgate device, reduces leakage further. A local read/write circuit is used as a level shifter between virtual ground vgnd and system ground levels, without need of additional circuit overhead.

In addition to the footer device 2, another device 3 is connected in parallel. This device 3 is controlled by a separate signal gndsel, which is used to switch the virtual ground vgnd level to system ground for high performance modes, maximizing the available SRAM cell supply voltage for the sub-array 1.

An analog switch 4 together with a resistor 5 is used to feedback the virtual ground vgnd voltage level to an operational amplifier 6. The resistor 5 is necessary to decouple the virtual ground vgnd levels of the different sub-arrays against each other. The operational amplifier 6 acts as a linear voltage regulator, adjusting voltage vctrl to achieve a virtual ground vgnd voltage equal to the level of the reference voltage input impressed on the non-inverting input 8 of the operational amplifier 6. This input 8 is used to preset the virtual ground vgnd level.

It is important to mention that the gates of the footer devices 2 of all sub-arrays 1 of the SRAM array are connected in parallel to the output of the operational amplifier 6, i.e. there is one operational amplifier 6 used to control the virtual ground vgnd voltage of all sub-arrays 1 of the SRAM array.

In case high performance mode of a sub-array 1 is activated, a signal gndsel for this particular sub-array 1 is asserted. At the same time, the analog switch 4 is opened to disconnect the feedback of this particular sub-array 1 from virtual ground vgnd. This ensures the regulation loop for the remaining sub-arrays is unaffected by the forced system ground voltage condition. At the end of the high performance mode, the signal gndsel for the particular sub-array 1 is deactivated and the sub-array 1 is supplied by virtual ground vgnd again. To do so, the switch 4 connects the virtual ground network 7 to the feedback network again.

The proposed method allows individually switching of sub-arrays to high performance mode, while keeping other sub-arrays in power saving mode, using only one global voltage regulator, i.e. one voltage regulator for the whole SRAM array.

The speed requirements for the regulation loop and the voltage regulator are reduced, because sub-arrays switched to high performance mode are detached from the feedback network, keeping the feedback loop in a stabilized state. Only one voltage regulator is necessary for a large number of SRAM sub-arrays, which reduces both, power and area requirements. The method allows supporting many different power saving modes while still supporting high-speed operation. The SRAM array may be operated in a variety modes, including a sleep mode, where the SRAM cell keeps its content, resulting in medium power savings, a standby mode, where the SRAM cell loses its content, resulting in very high power savings and a performance mode, where the SRAM cell can be operated at high speed.

Fast switching between high performance and power saving mode is possible because the switching operation is performed on a sub-array basis. The level of granularity, i.e. the number of sub-arrays a SRAM array is subdivided into, can be modified to meet actual power and/or performance requirements. The speed requirements for the voltage regulator, i.e. the operational amplifier 6, the feedback network and the footer device 2 are reduced, allowing usage of smaller circuits consuming less power. Finally, the active voltage regulation loop compensates for process/voltage and temperature variations of the footer devices and the SRAM cells. The preset virtual ground voltage level is stabilized.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method to reduce leakage of a Static Random Access Memory (SRAM) array comprising:
   subdividing the SRAM array into a plurality of sub-arrays;
   independently controlling the supply voltages of the sub-arrays;
   coupling the plurality of sub-arrays to a regulated virtual ground level having an electric potential higher than a system ground level;
   switching one or more of the plurality of subarrays from a power saving mode to a high performance mode by individually disconnecting them from the regulated virtual ground level and connecting them to system ground level, while maintaining other sub-arrays in the power saving mode;
   integrating an on-chip voltage regulator with the SRAM array capable of supplying a regulated virtual ground level higher than a system ground level to each of the plurality of sub arrays;
   employing a local read/write circuit as a level shifter between the virtual ground level and the system ground level; and
   decoupling one of the plurality of sub-arrays from a feedback network regulating the virtual ground level when switching from the power save mode to the high performance mode.

2. The method according to one of the claim 1, further comprising decoupling one of the plurality of sub-arrays from a feedback network regulating the virtual ground level when switching from the power save mode to the high performance mode.

3. A controller circuit integral to an SRAM array to independently direct a plurality of voltages supplied to a plurality of sub-arrays within the SRAM array, comprising:
   a voltage regulator capable of supplying a regulated virtual ground level greater than a system ground level to each of the plurality of sub-arrays, the voltage regulator having an independent virtual ground network dedicated to each of the plurality of subarrays,
   wherein the voltage regulator further comprises a feedback network regulating the virtual ground level, the feedback network including an operational amplifier and for each sub-array an analog switch and a resistor adapted to feedback the virtual ground voltage level to the operational amplifier, wherein for high performance mode of a particular sub-array, the analog switch of a said particular sub-array is opened to disconnect the feedback of this particular sub-array from the virtual ground level;

a switch matrix coupled to each of the plurality of subarrays capable of individually configuring the plurality of sub-arrays in a high performance mode or a power saving mode by individually disconnecting one or more of the plurality of sub-arrays from the regulated virtual ground level and connecting to the system ground level, while keeping other sub-arrays in the power saving mode;

comprising a footer device coupled with the virtual ground network, wherein a gate of the footer device is driven by a control voltage to adjust the voltage level of the virtual ground network; and a switch connected in parallel with the footer device adapted to switch the virtual ground network between a virtual ground level and a system ground level.

4. The controller circuit according to claim 3, wherein the gates of the footer devices for each of the plurality of sub-arrays are connected in parallel to an output of the operational amplifier.

5. The controller circuit according to claim 3, wherein the voltage regulator provides a regulated virtual positive voltage level to each of the plurality of sub-arrays are, wherein said regulated virtual positive voltage level has an electric potential lower than a positive system voltage level, and wherein the switching matrix disconnects the subarrays from the regulated virtual positive voltage level and connects them to the positive system voltage level, while keeping other sub-arrays in a power saving mode.

* * * * *